(12) United States Patent
Sushihara et al.

(10) Patent No.: US 7,061,419 B2
(45) Date of Patent: Jun. 13, 2006

(54) A/D CONVERTER AND A/D CONVERTING SYSTEM

(75) Inventors: Koji Sushihara, Ikoma (JP); Takashi Morie, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/010,423

(22) Filed: Dec. 14, 2004

(65) Prior Publication Data

US 2006/0055578 A1  Mar. 16, 2006

(30) Foreign Application Priority Data

Aug. 18, 2004  (JP) .............................. 2004-238094

(51) Int. Cl.
  *H03M 1/12*  (2006.01)
(52) U.S. Cl. ...................................... 341/155; 341/161
(58) Field of Classification Search ........ 341/150–170, 341/120
  See application file for complete search history.

(56) References Cited

U.S. PATENT DOCUMENTS 6,480,133 B1 *  11/2002  Kobayashi et al. ......... 341/156
6,570,522 B1 *  5/2003  Galambos et al. ......... 341/155
6,710,734 B1    3/2004  Ono et al.

FOREIGN PATENT DOCUMENTS

| JP | 61-171331 A    | 10/1986 |
| JP | 4-043718 A     | 2/1992  |
| JP | 2003-158456 A  | 5/2003  |
| JP | 2003-218697 A  | 7/2003  |

* cited by examiner

*Primary Examiner*—Lam T. Mai
(74) *Attorney, Agent, or Firm*—McDermott Will & Emery LLP

(57) ABSTRACT

In a flash A/D converter including a plurality of differential amplifier circuits and a plurality of voltage comparator circuits, a regulator circuit is provided. The regulator circuit automatically regulates a bias voltage of each of the plurality of differential amplifier circuits in a differential amplifier circuit array to make an output dynamic range for the differential amplifier circuits match an input dynamic range for the plurality of voltage comparator circuits. Therefore, even if the input dynamic range for the voltage comparator circuits is narrowed with reduction in a power supply voltage, the output dynamic range for the differential amplifier circuits and the input dynamic range for the voltage comparator circuits match, thus resulting in a high A/D conversion accuracy.

12 Claims, 8 Drawing Sheets

FIG. 2 <u>An</u> DIFFERENTIAL AMPLIFIER CIRCUIT
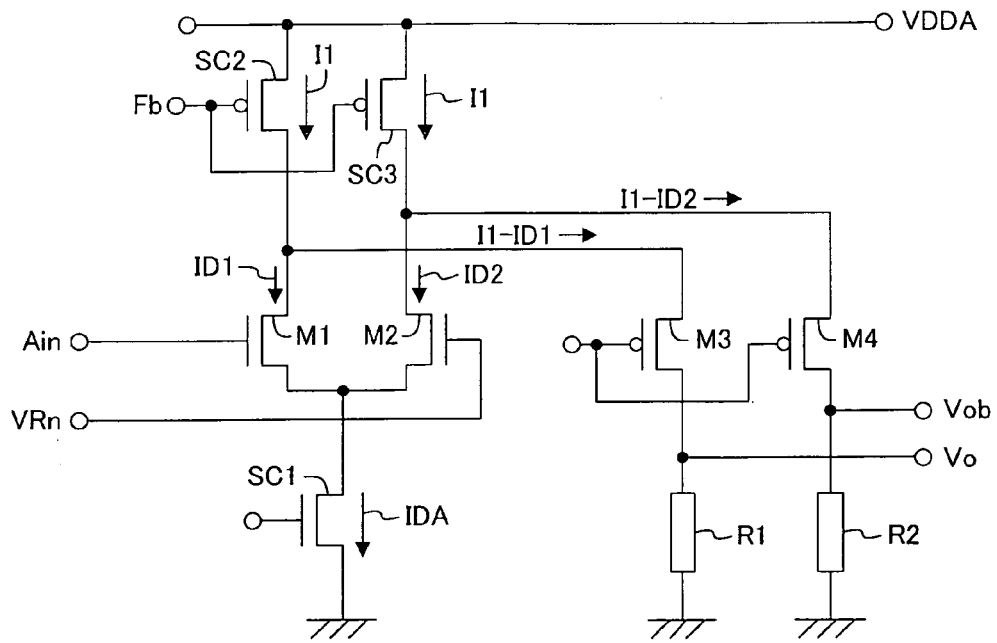
FIG. 3
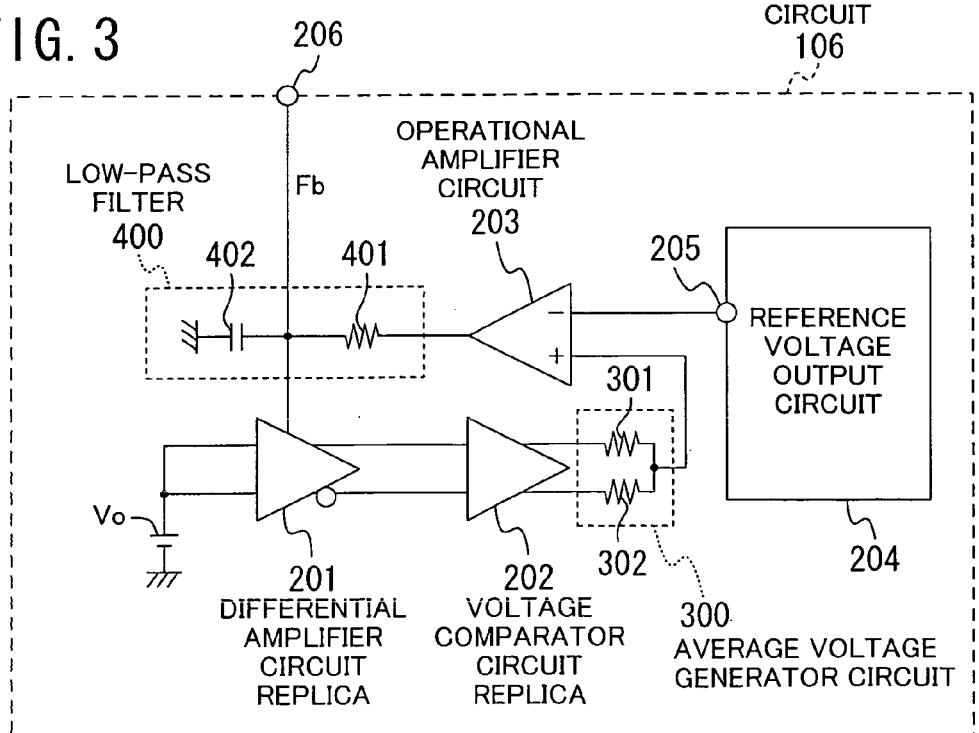

A/D CONVERTER AND A/D CONVERTING SYSTEM

CROSS REFERENCE TO RELATED APPLICATIONS

This non-provisional application claims priority under 35 U.S.C. § 119(a) on patent application Ser. No. 2004-238094 filed in Japan on Aug. 18, 2004, the entire contents of which are hereby incorporated by reference.

BACKGROUND OF THE INVENTION

The present invention relates to A/D converters, and more particularly relates to a technique for suppressing degradation of A/D conversion characteristics due to changes in a power supply voltage, a surrounding temperature, properties of a semiconductor device or the like.

FIG. 12 is a block diagram illustrating the configuration of a known A/D converter. The A/D converter of FIG. 12 is a full-flash type A/D converter and includes a reference voltage generator circuit 701, a differential amplifier circuit array 702, a voltage comparator circuit array 703, and an encoder circuit 705.

The reference voltage generator circuit 701 generates a plurality of reference voltages VR1 through VRn+1 by dividing by a plurality (n) of resistors R1 through Rn a voltage between a high voltage side reference voltage applied to a high voltage side terminal 701a and a lower voltage side reference voltage applied to a low voltage side terminal 701b. The generated reference voltages VR1 through VRn+1 are input to the differential amplifier circuit array 702. The differential amplifier circuit array 702 includes n+1 differential amplifier circuits A1 through An+1. Each of the differential amplifier circuits A1 through An+1 amplifies a differential voltage between an analog signal voltage input from an analog voltage input terminal 704 and an associated one of the reference voltages VR1 through VRn+1 to a power supply voltage and then outputs complimentary non-inversion and inversion output voltages, simultaneously with the other ones of the differential amplifier circuits. The voltage comparator circuit array 703 includes n+1 voltage comparator circuits Cr1 through Cr+1. Each of the voltage comparator circuits Cr1 through Cr+1 compares the levels of the non-inversion and inversion output voltages from the associated one of the differential amplifier circuits A1 through An+1 in a previous stage to each other, simultaneously with the other ones of the voltage comparator circuits. The encoder circuit 705 converts n+1 comparison results output from the voltage comparator circuit array 703 and then outputs a single digital data signal having a predetermined resolution.

Compared to various other types of A/D converters such as an integral-mode converter, a serial-parallel converter and a pipeline type converter, the known A/D converter having the above-described parallel structure has the advantage of allowing high-speed A/D conversion. At the same time, however, the known A/D converter has a disadvantage. That is, with the known A/D converter, as the resolution is increased, the differential amplifier circuits and the voltage comparator circuits are increased in number, thus increasing in power consumption and an area of the circuits.

As an A/D converter devised to improve the above-described disadvantage, a technique for dividing an output voltage of a differential amplifier circuit by resistors or the like to interpolate the output voltage is disclosed, for example, in Japanese Laid-Open Patent No. 4-43718. In this technique, respective output voltages from two adjacent differential amplifier circuits are interpolated, and voltage comparison is performed in a voltage comparator circuit using interpolated voltages. Thus, compared to the case where the voltages are not interpolated, the number of differential amplifier circuits can be reduced to a fraction of interpolation bits, so that power consumption and area of an A/D converter can be reduced.

Moreover, conventionally, as an A/D converter of which power consumption is reduced furthermore, an A/D converter using a dynamic voltage comparator circuit as a voltage comparator circuit is disclosed, for example, in Japanese Laid-Open Publication No. 2003-158456. In this technique, instead of a constant current type voltage comparator circuit which is used in a general A/D converter, performs high-speed operation and has excellent responsivity, a dynamic voltage comparator circuit which does not need a constant current is used. Thus, power consumption can be largely reduced.

In recent years, with miniaturization in the semiconductor device fabrication process technology, a power supply voltage is set to be low in many cases. With such a low power supply voltage, an input dynamic range for a plurality of voltage comparator circuits of an A/D converter becomes smaller.

In view of the above-described points, the present inventors examined known A/D converters including the above-described two A/D converters and found the following fact. In a known A/D converter, as an input dynamic range for a voltage comparator circuit is reduced, a margin of an output range for a differential amplifier circuit is reduced. Thus, in the known A/D converter, when changes in semiconductor device fabrication processes represented by change in a threshold voltage of a transistor, a power supply voltage, or a surrounding temperature occur, each of the input dynamic range for a voltage comparator circuit and an output dynamic range for a differential amplifier circuit is changed, so that the input dynamic range and the output dynamic range do not match. This causes the problem of reduction in A/D conversion accuracy.

SUMMARY OF THE INVENTION

It is an object of the present invention to suppress, in a flash A/D converter, mismatch between an output dynamic range for differential amplifier circuits and an input dynamic range for voltage comparator circuits due to changes in fabrication processes for a semiconductor device with a simple configuration, thereby improving A/D conversion accuracy.

To achieve the above-described object, according to the present invention, adopted is a configuration in which even if the output dynamic range for differential amplifier circuits and the input dynamic range for voltage comparator circuits do not match with high accuracy due to changes in fabrication processes for a semiconductor device, a regulator circuit for regulating the output dynamic range for differential amplifier circuits is separately disposed.

Specifically, an A/D converter according to the present invention is characterized by including: a reference voltage generator circuit for generating a plurality of reference voltages; a plurality of differential amplifier circuits, provided so as to correspond to the reference voltages generated by the reference voltage generator circuit, each for receiving an associated one of the reference voltages and a common input signal voltage, amplifying a voltage difference between the associated reference voltage and the input signal voltage and outputting complimentary non-inversion and inversion output voltages; a plurality of voltage comparator circuits, provided so as to correspond to the differential amplifier circuits, each for comparing the non-inversion and inversion output voltages from an associated one of the differential amplifier circuits and outputting a digital signal corresponding to a relationship between the non-inversion and inversion voltages in terms of voltage level; a coding circuit for coding a plurality of digital signals output from the plurality of voltage comparator circuits and outputting as a single digital data signal corresponding to the input signal voltage; and a regulator circuit for regulating the non-inversion and inversion output voltages of the plurality of differential amplifier circuits so that the non-inversion and inversion voltages are in an input range for the plurality of voltage comparator circuits.

In one embodiment of the present invention, the A/D converter is characterized in that the regulator circuit includes a differential amplifier circuit replica, formed so as to have the same circuit configuration and shape as those of the differential amplifier circuits, for receiving an equal voltage to a voltage supplied to the differential amplifier circuit and outputting a common mode voltage, and an operational amplifier circuit for generating a feedback control voltage so that the common mode voltage output from the differential amplifier circuit replica matches a predetermined reference voltage and sending the feedback control voltage back to the differential amplifier circuit replica, and the feedback control voltage from the operational amplifier is sent back to the plurality of differential amplifiers.

In another embodiment of the present invention, the A/D converter is characterized in that the regulator circuit further includes a voltage comparator circuit replica, disposed between the differential amplifier circuit replica and the operational amplifier circuit and formed so as to have the same configuration and shape as those of the voltage comparator circuits, for receiving the common mode voltage from the differential amplifier circuit replica and outputting a common mode voltage corresponding to the received common mode voltage, and the operational amplifier circuit generates a feedback control voltage so that the common mode voltage from the voltage comparator circuit replica matches a predetermined reference voltage.

In another embodiment of the present invention, the A/D converter is characterized in that the regulator circuit further includes an average voltage generator circuit, disposed between the voltage comparator circuit replica and the operational amplifier circuit, for receiving two common mode voltages from the voltage comparator circuit replica and generating an average voltage of the common mode voltages, and the operational amplifier circuit generates a feedback control voltage so that the average voltage of the common mode voltages from the average voltage generator circuit matches the predetermined reference voltage.

In another embodiment of the present invention, the A/D converter is characterized in that the regulator circuit further includes a low-pass filter, disposed in an output side of the operational amplifier circuit, for removing a high-frequency component of the feedback control voltage from the operational amplifier circuit.

In another embodiment of the present invention, the A/D converter is characterized in that the regulator circuit further includes a reference voltage output circuit for generating the predetermined reference voltage and outputting the predetermined reference voltage, and the reference voltage output circuit includes a reference voltage generator circuit for generating a plurality of reference voltages, and a selector circuit for receiving a selection signal, selecting any one of the plurality of reference voltages generated in the reference voltage generator circuit based on the selection signal, and outputting the selected voltage as the predetermined reference voltage.

In another embodiment of the present invention, the A/D converter is characterized in that the reference voltage output circuit includes a decoder for receiving a control signal from the outside, generating the selection signal based on the control signal, and outputting the generated selection signal to the selector circuit.

In another embodiment of the invention, the A/D converter is characterized in that the reference voltage output circuit provided in the regulator circuit includes a resistor ladder, disposed between a power supply and a ground and formed of a plurality of resistors connected in series, for generating a different reference voltage between terminals of each of the plurality of resistors.

In another embodiment of the present invention, the A/D converter is characterized in that each of the plurality of voltage comparator circuits includes an input transistor section operating in a linear region having two NMOS transistors operating in a linear region for receiving non-inversion and inversion output voltages from an associated one of the differential amplifier circuits at gates, respectively, and a positive feedback section connected to respective drains of the two NMOS transistors and constituting a cross inverter latch.

In another embodiment of the present invention, the A/D converter is characterized in that the reference voltage generator circuit of the reference voltage output circuit includes a plurality of voltage producing circuits, and each of the plurality of voltage producing circuits produces a single reference voltage which is different from the other reference voltages, includes a diode connection section and two resistors connected to the diode connection section, and outputs as the single reference voltage a voltage at a predetermined node in the diode connection section or a voltage generated at either one of two connection points of the diode connection section and the two resistors.

In another embodiment of the present invention, the A/D converter is characterized in that each of the two resistors is formed of a resistor with positive temperature dependency.

Moreover, an A/D converting system according to the present invention is an A/D converting system including said A/D converter and an adaptive circuit connected to the A/D converter and characterized in that the adaptive circuit for adaptively controlling the predetermined reference voltage generated by the reference voltage output circuit provided in the A/D converter.

In one embodiment of the present invention, the A/D converter is characterized in that the adaptive circuit includes a test signal generator circuit for generating an analog test signal, outputting the test signal to the A/D converter, and making the A/D converter A/D-convert the test signal, a memory for storing an A/D conversion characteristic when the A/D converter has A/D-converted the test signal, and a control signal generator circuit for evaluating the A/D conversion characteristic stored in the memory, generating a control signal according to a result of the evaluation, and outputting the control signal to a decoder provided in the reference voltage output circuit of the A/D converter.

As has been described, according to the present invention, the regulator circuit regulates an output range including non-inversion or inversion output voltages of each differential amplifier circuit. Thus, even when variations in the output range of each differential circuit occur due to changes in fabrication processes for a semiconductor device, the output range of each differential amplifier circuit is in the input range of each voltage comparative circuit, so that A/D conversion accuracy is increased.

Specifically, in one embodiment of the present invention, when the regulator circuit regulates a common mode voltage of each differential amplifier circuit so that the common mode voltage becomes a reference voltage corresponding to a center voltage of the input range for the output comparator circuits, the reference voltage can be regulated. Accordingly, even when the reference voltage itself varies between a circuit design and an actual circuit or when the reference voltage is changed due to changes in power supply voltage and a surrounding temperature, the output range for each differential amplifier circuit is reliably in the input range for each voltage comparator circuit, so that A/D converter accuracy is increased.

BRIEF DESCRIPTION OF THE DRAWINGS

FIG. 2 is a diagram illustrating the internal configuration of a differential amplifier circuit provided in the A/D converter.

FIG. 3 is a block diagram illustrating the internal configuration of a regulator circuit provided in the A/D converter.

DESCRIPTION OF THE PREFERRED EMBODIMENTS

Hereinafter, an A/D converter according to each of preferred embodiments of the present invention will be described with reference to the accompanying drawings.

First Embodiment

Figure 1:
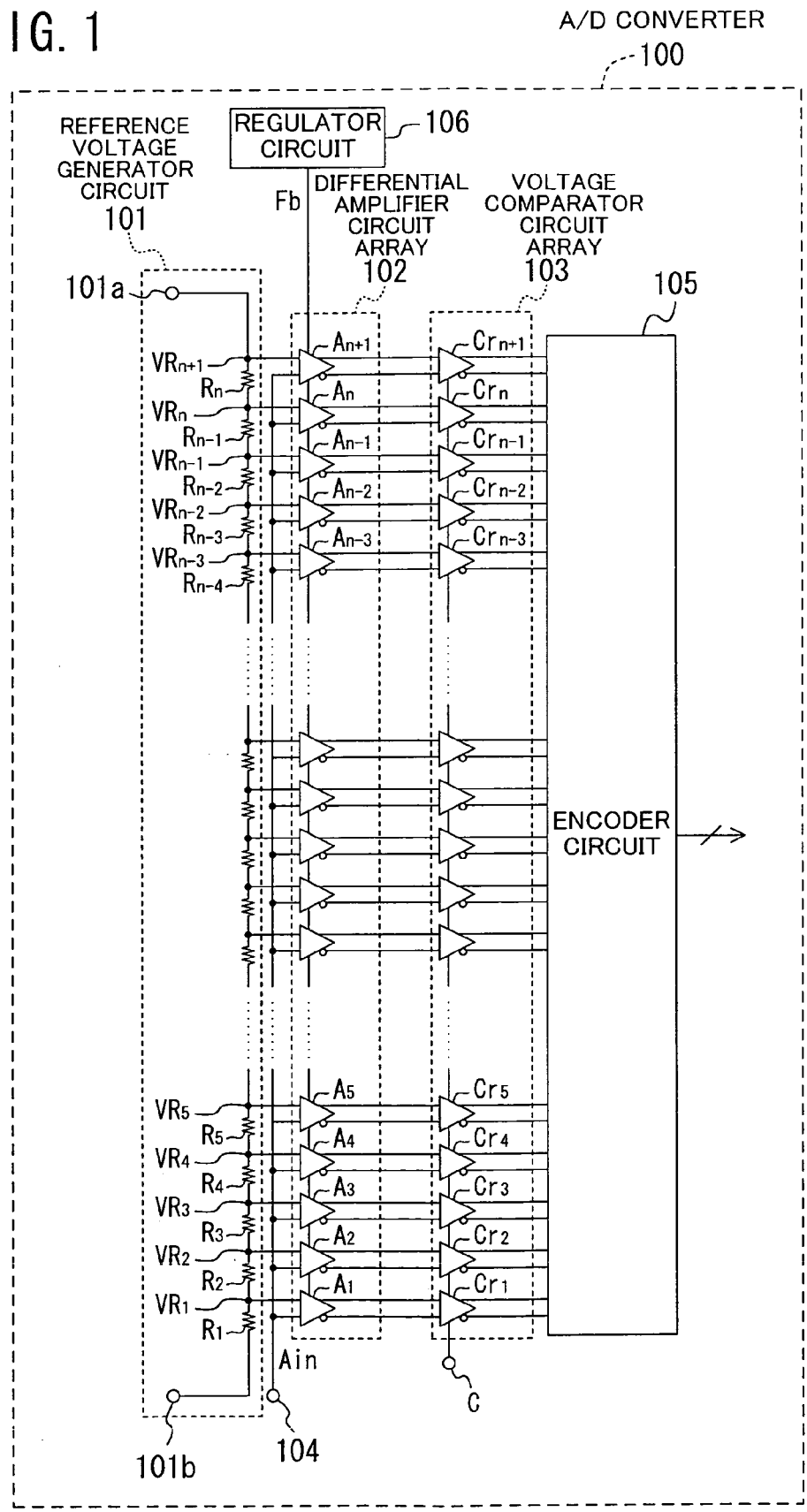
FIG. 1 is a block diagram illustrating the entire configuration of an A/D converter according to a first embodiment of the present invention.

FIG. 1 is a circuit diagram illustrating the entire configuration of an A/D converter according to a first embodiment of the present invention.

In FIG. 1, an A/D converter 100 includes a reference voltage generator circuit 101, a differential amplifier circuit array 102, a voltage comparator circuit array 103, an encoder circuit (coding circuit) 105, and a regulator circuit 106.

The reference voltage generator circuit 101 generates a plurality (n+1) of reference voltages VR1 through VRn+1 by dividing a voltage between a high voltage side reference voltage applied to a high voltage side terminal 101a and a low voltage side reference voltage applied to a low voltage side terminal 101b by a plurality (n) of resistors R1 through Rn connected in series.

The generated reference voltages VR1 through VRn+1 are input to a differential amplifier circuit array 102. The differential amplifier circuit array 102 includes n+1 differential amplifier circuits A1 through An+1. Each of the differential amplifier circuits A1 through An+1 includes two input terminals and one of the input terminals receives an input analog signal voltage Ain from an analog signal voltage input terminal 104 and the other one of the input terminals receives an associated one of the reference voltages VR1 through VRn+1. Each of the differential amplifier circuits amplifies a differential voltage between the analog signal voltage Ain input from the analog signal voltage input terminal 104 and the associated one of the reference voltages VR1 through VRn+1 to a power supply voltage and then outputs complementary non-inversion output and inversion output voltages, simultaneously with the other ones of the differential amplifier circuits.

The voltage comparator circuit array 103 includes n+1 voltage comparator circuits Cr1 through Crn+1 for performing an operation according to a clock signal from a clock terminal C. Each of the voltage comparator circuits Cr1 through Crn+1 receives the non-inversion and inversion output voltages from an associated one of the differential amplifier circuits in the previous stage, compares the levels of the non-inversion and inversion output voltages to each other for every predetermined interval according to the clock signal, and then a result of the comparison is output to the encoder circuit 105 as a digital signal. The digital signal is, for example, an H or L level digital signal according to the comparison result.

The encoder circuit 105 converts comparison result for n+1 digital values output from the voltage comparator circuit array 103, generates a single digital data signal having a predetermined resolution, and then outputs the digital data signal.

Then, the regulator circuit 106, i.e., a feature component of an A/D converter according to the present invention generates a feedback bias voltage (feedback control voltage) Fb so that the level of each of the non-inversion and inversion output voltages of each of the plurality of differential amplifier circuits A1 through An+1 in the differential amplifier circuit array 102 are in an input range for the voltage comparator circuits Cr1 through Crn+1 in the voltage comparator circuit array 103, and then performs bias regulation for the differential amplifier circuits A1 through An+1. Details of the regulator circuit 106 will be described later.

Next, the configuration of the differential amplifier circuits A1 through An+1 in the differential amplifier circuit array 102 will be described. Each of the differential amplifier circuits has the same configuration. FIG. 2 is a block diagram illustrating the internal configuration of a differential amplifier circuit An and the configuration of the differential amplifier circuit An will be hereinafter described. In FIG. 2, the differential amplifier circuit An includes a differential pair including an NMOS transistor M1 for receiving at the gate an analog signal voltage Ain from the analog signal voltage input terminal 104 and an NMOS transistor M2 for receiving at the gate a reference voltage VRn generated in the reference voltage generator circuit 101. One end of a constant current supply SC1 which is formed of a single NMOS transistor and supplies a constant current IDA is connected to the source of each of the transistors M1 and M2, while the other end of the constant current supply SC1 is grounded. On the other hand, one end of each of constant current supplies SC2 and SC3 each of which is formed of a single PMOS transistor and supplies a constant current I1 is connected to the drain of each of the NMOS transistors M1 and M2. A power supply voltage VDDA is supplied to the other end of each of the constant current supplies SC2 and SC3.

Furthermore, in the differential amplifier circuit An of FIG. 2, the respective sources of PMOS transistors M3 and M4 are connected to a node between the transistor M1 and the constant current supply SC2 and a node between the transistor M2 and the constant current supply SC3, respectively. An end of each of load resistors R1 and R2 is connected to the drain of each of the transistors M3 and M4 and the other end of each of the load resistors is grounded. The two PMOS transistors M3 and M4 together form a cascode circuit. Output terminals Vob and Vo are connected to a node between the PMOS transistor M3 and the load resistor R1 and a node between the PMOS transistor M4 and the load resistor R2, respectively.

The operation of the differential amplifier circuit An will be described as follows. In the NMOS transistor M1, a drain current ID1 according to the analog signal voltage Ain flows. In the NMOS transistor M2, a drain current ID2 according to the reference voltage VRn flows. The sum of the drain currents ID1 and ID2 is equal to the constant current IDA of the constant current supply SC1 (ID1+ID2=IDA). In this case, the constant current I1 of each of the constant current supplies SC2 and SC3 is set to be a higher value than that of each of the drain currents ID1 and ID2 (I1>ID1, ID2). Accordingly, a differential current (I1−ID1) flows in each of the PMOS transistor M3 and the load resistor R1 and a differential current (I1−D2) flows in each of the PMOS transistor M4 and the load resistor R2. As a result, at the output terminals Vob and Vo, the following output voltages appear, respectively.

$Vo = R1(I1 - ID1)$ $Vob = R2(I1 - ID2)$

Then, if it is assumed that each of the load resistors R1 and R2 takes the same resistance value R, a voltage (Vo−Vob) between the output terminals Vob and Vo is expressed by the following equation.

$Vo - Vob = R(ID2 - ID1)$

In this embodiment, if the respective constant currents I1 of the constant current supplies SC2 and SC3 are regulated by inputting the feedback bias voltage Fb from the regulator circuit 106 to the gate of each of the two PMOS transistors forming the constant current supplies SC2 and SC3, respectively, the voltage (Vo−Vob) between the output terminals is regulated. Note that, instead of the current sources SC2 and SC3, the feedback bias voltage Fb from the regulator circuit 106 may be input to the gate of the NMOS transistor forming the constant current supply SC1.

Subsequently, the internal configuration of the regulator circuit 106 provided in the A/D converter 100 will be described. The regulator circuit 106 of FIG. 3 includes a differential amplifier circuit replica 201, a voltage comparator circuit replica 202, an operational amplifier circuit 203, and a reference voltage output circuit 204.

The differential amplifier circuit replica 201 has the same circuit configuration and shape as those of each of the differential amplifier circuits A1 through An+1 of the differential amplifier circuit array 102 and the same voltage as the power supply voltage VDDA for the differential amplifier circuits A1 through An+1 is supplied to the differential amplifier circuit replica 201. A same voltage, i.e., a voltage Vo is input to each of two input terminals of the differential amplifier circuit replica 201 and two common mode voltages are output from the differential amplifier circuit replica 201. The voltage comparator circuit replica 202 has the same circuit configuration and shape as those of the voltage comparator circuits Cr1 through Crn+1 of the voltage comparator circuit array 103. The voltage comparator circuit replica 202 receives the two common mode voltages from the differential amplifier circuit replica 201 and outputs two common mode voltages according to the received two common mode voltages.

The two common mode voltages output from the voltage comparator circuit replica 202 are input to an average voltage generator circuit 300 including a resistor 301 and a resistor 302 each of which receives at one end an associated one of the common mode voltages. In the average voltage generator circuit 300, the other end of the resistor 301 and the other end of the resistor 302 are connected to each other. If an offset exists between the two common mode voltages from the voltage comparator circuit replica 202, a node between the respective other ends of the resistors 301 and 302 outputs a voltage at a midpoint level between the common mode voltages, i.e., an average common mode voltage.

Furthermore, in the regulator circuit 106 of FIG. 3, the reference voltage output circuit 204 outputs a single reference voltage which is equal to a center voltage of the input dynamic range for the voltage comparator circuits Cr1 through Crn+1 of the A/D converter 100. Moreover, the operational amplifier circuit 203 receives an average common mode voltage from the average voltage generator circuit 300 and a single reference voltage output from an output terminal 205 of the reference voltage output circuit 204. In the operational amplifier circuit 203, a feedback bias voltage is output so that the average common mode voltage which has been output from the voltage comparator circuit replica 202 and passed through the average voltage generator circuit 300 matches the reference voltage (i.e., the center voltage of the input dynamic range for the voltage comparator circuits Cr1 through Crn+1). To the output side of the operational amplifier circuit 203, a low-pass filter 400 is connected. The low pass filter 400 includes a resistor 401 and a capacitor 402 and removes high frequency components contained in the feedback bias voltage from the operational amplifier circuit 203. The feedback bias voltage Fb from which high frequency components have been removed is sent back to the differential amplifier circuit replica 201 in the regulator circuit 106 and then is sent back to the differential amplifier circuits A1 through An+1 of the differential amplifier circuit array 102 of FIG. 1 via an output terminal 206.

Therefore, in this embodiment, when changes in fabrication processes for the differential amplifier circuits A1 through An+1 constituting the A/D converter 100 due to variations in process steps for fabricating a semiconductor device such as a transistor, a resistor, a capacitor and the like which together form each of the differential amplifier circuits A1 through An+1, changes in fabrication processes for the differential amplifier circuit replica 201 in the regulator circuit 106 occur as well, so that the average common mode voltage which has been output from the voltage comparator circuit replica 202 and passed through the average voltage generator circuit 300 is changed. However, the operational amplifier circuit 203 generates a feedback bias voltage so that the average common mode voltage matches a reference voltage of the reference voltage output circuit 204. The feedback bias voltage Fb from which high frequency components have been removed by the low-pass filter 400 is sent back to the differential amplifier circuit replica 201 and the plurality of differential amplifier circuits A1 through An+1. Thus, the average common mode voltage from the voltage comparator circuit replica 202 accurately matches the reference voltage of the reference voltage output circuit 204, so that the common mode voltage of the differential amplifier circuit replica 201 is at the center of the input dynamic range for the comparator circuit replica 202. As a result, the non-inversion and inversion output voltages of the differential amplifier circuits A1 through An+1 of the differential amplifier circuit array 102 can become accurately in the input dynamic range for the voltage comparator circuits Cr1 through Crn+1 of the voltage comparator circuit array 103 at all the time.

Moreover, in the regulator circuit 106, particularly, the voltage comparator circuit replica 202 is disposed in the output side of the differential amplifier circuit replica 201. Therefore, also if changes in fabrication processes for the voltage comparator circuits Cr through Crn+1 occur due to variations in process steps for fabricating a semiconductor device such as a transistor, a resistor, and a capacitor which together form each of the voltage comparator circuits Cr through Crn+1, changes in fabrication processes for the voltage comparator circuit replica 202 in the regulator circuit 106 occur as well, so that the common mode voltage from the voltage comparator circuit replica 202 is changed. However, in the same manner as described above, based on the feedback bias voltage from the operational amplifier circuit 203, the non-inversion and inversion output voltages of each of the differential amplifier circuits A1 through An+1 of the differential amplifier circuit array 102 become accurately in the input dynamic range for the voltage comparator circuit Cr1 through Crn+1 of the voltage comparator circuit array 103 at all the time. Accordingly, even if not only changes in fabrication processes for the differential amplifier circuits A1 through An+1 of the differential amplifier circuit array 102 but also changes in fabrication processes for the voltage comparator circuits Cr1 through Crn+1 in the voltage comparator circuit array 103 occur, it is possible to cope with the changes in fabrication processes for voltage comparator circuits Cr1 through Crn+1 and also to have the non-inversion and inversion output voltages of each of the differential amplifier circuits A1 through An+1 become even more accurately in the input dynamic range for the voltage comparator circuits Cr1 through Crn+1 at all the time.

Therefore, although in this embodiment, the voltage comparator circuit replica 202 is disposed in the regulator circuit 106, it is not necessary to dispose the voltage comparator circuit replica 202 if only changes in fabrication processes for the differential comparator circuit A1 through An+1 in the differential amplifier circuit array 102 are taken into consideration.

Furthermore, the low-pass filter 400 is disposed in the output side of the operational amplifier circuit 203. Thus, high-frequency noise contained in the feedback bias voltage from the operational amplifier circuit 203 is removed. Therefore, a stable operation can be performed without influences of the high-frequency noise given to the operation of each of the differential amplifier circuit replica 201 and the differential amplifier circuits A1 through An+1. Note that when the circuit scale of each of the differential amplifier circuits A1 through An+1 of the differential amplifier circuit array 102 is sufficiently large, a parasitic resistance (interconnect resistance) of each of the differential amplifier circuits or a parasitic capacitance which an interconnect or each of the differential amplifier circuits itself becomes large and thus the same effect as that of the low-pass filter 400 is achieved. Therefore, it is not necessarily to dispose the low-pass filter 400 therein.

In addition, in this embodiment, an average common mode voltage is obtained by averaging out common mode voltages from the voltage comparator circuit replica 202 by the average voltage generator circuit 300. However, needless to say, the present invention is not limited thereto, but when an offset of an output of the voltage comparator circuit replica 202 is relatively small, one of the two common mode voltages of the voltage comparator circuit replica 202 may be input to the operational amplifier circuit 203.

Moreover, in this embodiment, the number of the differential amplifier circuits A1 through An+1 is the same as the number of the voltage comparator circuits Cr1 through Crn+1. However, the present invention is not limited thereto but is applicable to the case where an output voltage of each of the differential amplifier circuits A1 through An+1 is divided (e.g., into two) by resistors for interpolation and the same number of differential amplifier circuits as a fraction of the number of the voltage comparator circuits (e.g., ½) are provided.

Internal Configuration of Reference Voltage Output Circuit

Figure 4:
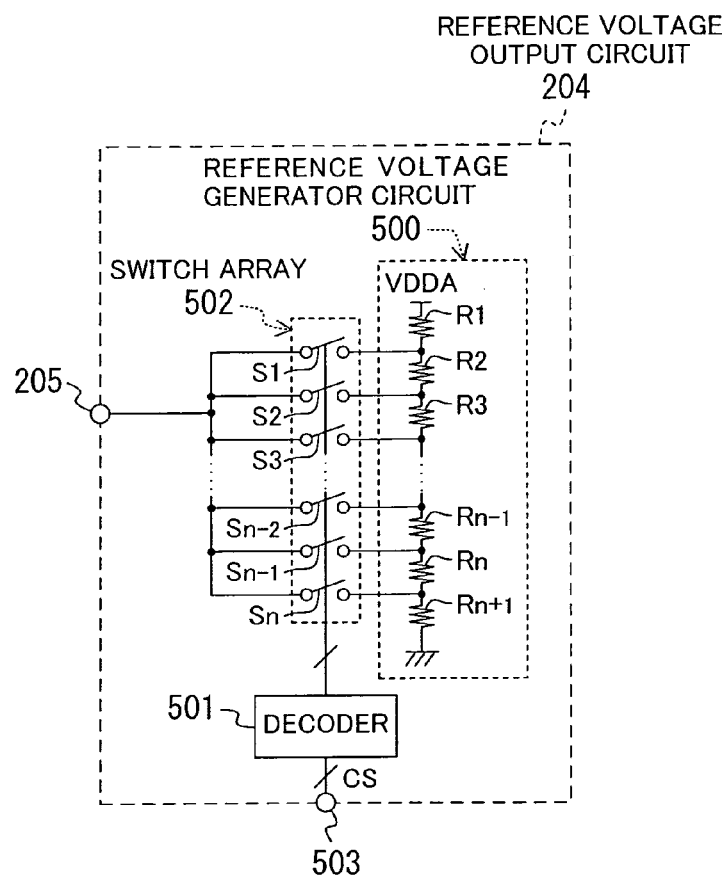
FIG. 4 is a diagram illustrating the internal configuration of a reference voltage output circuit provided in the regulator circuit.

Next, the reference voltage output circuit 204 of the regulator circuit 106 of FIG. 3 will be described with reference to FIG. 4 illustrating the internal configuration of the reference voltage output circuit 204.

The reference voltage output circuit 204 of FIG. 4 includes a reference voltage generator circuit 500, a switch array 502, and a decoder 501. The reference voltage generator circuit 500 is formed so that a resistor ladder including n+1 resistors R1 through Rn+1 connected in series is disposed between the power supply voltage VDDA and the ground and generates a reference voltage between terminals of each of the resistors. Moreover, the switch array (selector circuit) 502 includes n switches S1 through Sn. With one of the switches closed, corresponding one of the n reference voltages generated in the reference voltage generator circuits 500 is selected and the selected reference voltage is output from an output terminal 205 and input to the operational amplifier 203 of FIG. 3. Furthermore, the decoder 501 receives a control signal CS from the outside via an input terminal 503. In response to the control signal CR, the decoder 501 generates a selection signal for selecting one of the n switches S1 through Sn of the switch array 502 and then outputs the selection signal to the corresponding one of the switches.

With the above-described configuration, the reference voltage output circuit 204 of FIG. 4 can select one of a plurality of reference voltages according to the control signal CS from the outside via the input terminal 503. Therefore, even if an optimum reference voltage in designing a circuit is different from an optimum reference voltage for an actual circuit, reference voltages can be externally regulated, so that the operation margin is increased.

Second Embodiment

Next, an A/D converter according to a second embodiment of the present invention will be described with reference to FIG. 5.

Figure 5:
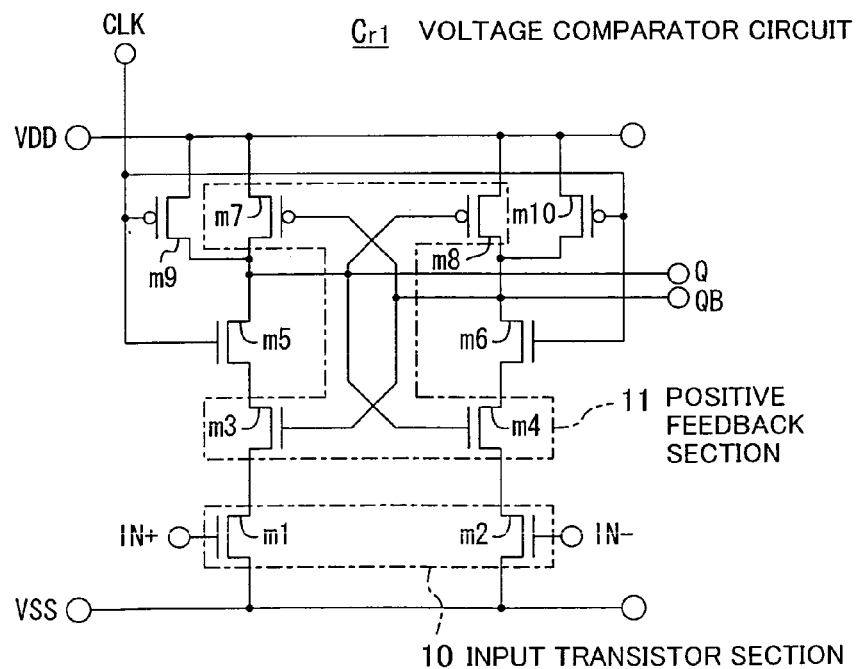
FIG. 5 is a diagram illustrating the internal configuration of a voltage comparator circuit provided in an A/D converter according to a second embodiment of the present invention.

FIG. 5 is a block diagram illustrating an exemplary arrangement of the voltage comparator circuits Cr1 through Crn+1 of the A/D converter 100 of FIG. 1. Each of the voltage comparator circuits Cr1 through Crn+1 has the same configuration and therefore the voltage comparator circuit Cr1 will be hereinafter described as an example.

The voltage comparator circuit Cr1 of FIG. 5 is a dynamic voltage comparator circuit characterized by its high-speed operation and low power consumption. The voltage comparator circuit Cr1 includes an input transistor section 10 with two NMOS transistors m1 and m2 and a positive feedback section 11 having a cross-couple inverter latch section with two NMOS transistors m3 and m4 and two PMOS transistors m7 and m8.

In the input transistor section 10, the two NMOS transistors m1 and m2 receive at their gates a non-inversion output voltage IN+ and an inversion output voltage IN− from the corresponding differential amplifier circuit A1, respectively. Respective sources of the NMOS transistors m1 and m2 are grounded. Moreover, in the positive feedback section 11, the power supply voltage VDD is applied to respective sources of the PMOS transistors m7 and m8. Respective drains of the two NMOS transistors m1 and m2 of the input transistor section 10 are connected to respective sources of the two NMOS transistors m3 and m4, respectively. Complimentary output terminals Q and QB are connected to respective gates of the PMOS transistors m7 and m8 of the positive feedback section 11.

Moreover, in the positive feedback section 11, an NMOS switch transistor m5 is disposed between the drain of the NMOS transistor m3 and the drain of the PMOS transistor m7. In the same manner, an NMOS switch transistor m6 is disposed between the drain of the MOS transistor m4 and the drain of the PMOS transistor m8. The location at which each of the NMOS switch transistors m5 and m6 is disposed is not limited to the above-described location. Furthermore, in the positive feedback section 11, a PMOS switch transistor m9 is disposed between the drain of the PMOS transistor m7 and the power supply source VDD. In the same manner, a PMOS switch transistor m10 is disposed between the drain of the PMOS transistor m8 and the power supply source VDD. A clock signal CLK is input to the gate of each of the NMOS switch transistors m5 and m6 and the PMOS transistors m9 and m10.

The input transistor section 10 is operated in a linear region. The drain voltage of each of the transistors m1 and m2 is changed according to the non-inversion output voltage IN+ or the inversion output voltage IN− of the differential amplifier circuit A1 input to the gate of the NMOS transistors m1 or m2. A difference in the two drain voltages is output as a comparison result to the positive feedback section 11. In the positive feedback section 11, according to the clock signal CLK, the comparison result output from the input transistor section 10 is amplified to the power supply voltage VDD. The positive feedback section 11 stores the amplified comparison result and outputs the comparison result as a digital signal from the output terminals Q and QB.

Hereinafter, the operation of the voltage comparator circuit Cr1 of FIG. 5 will be specifically and simply described. When the clock signal CLK is "Low", the NMOS switch transistors m5 and m6 are turned OFF and the PMOS transistors m9 and m10 are turned ON. Accordingly, the positive feedback section 11 is not operated and the output terminals Q and QB are pulled up, so that each of the output signals Q and QB is fixed to be "High" (reset state). At this time, a current does not flow at all in the voltage comparator circuit Cr1.

Thereafter, when the clock signal becomes "High", the NMOS switch transistors m5 and m6 are turned ON and the PMOS switch transistors m9 and m10 are turned OFF, so that the positive feedback section 11 becomes operable. In this case, the NMOS transistors m1 and m2 are operated in a linear region in which a drain current is linearly changed according to a gate voltage. A drain voltage VDS1 according to a gate voltage of the NMOS transistor m1 is generated in the NMOS transistor m1 and a drain voltage VDS2 according to a gate voltage of the NMOS transistor m2 is generated in the NMOS transistor m2. The positive feedback section 11 performs positive feedback of a voltage difference between the drain voltages (VDS1−VSD2), the voltage difference is amplified up to the power supply voltage (VDD), and the amplified voltage difference is maintained as it is. For example, when as for the drain voltages, VDS1<VDS2 holds, positive feedback of a voltage difference between the drain voltages is performed, so that the output terminal Q is amplified to the power supply voltage VDD and the output terminal QB is amplified to the ground (VSS). In contrast, when VDS1<VDS2 holds, positive feedback of the voltage difference is performed, so that the output terminal Q is amplified to the ground (VSS) and the output terminal QB is amplified to the power supply voltage VDD (compare and latch state).

In the compare and latch state, a current flows in a period from the time when the clock signal is turned "High" to the time when a voltage difference between respective outputs of the output terminals Q and QB is amplified to the power supply voltage VDD according to the input signals IN+ and IN−, but a current does not flow in a period in which the respective output voltages at the output terminals Q and QB are maintained.

As described above, when the clock signal is "Low", a current does not flow at all, and when the clock signal is "High", a current flows until the respective output voltages of the output terminals Q and QB of the voltage comparator circuit A1 are amplified, but a current does not flow during the period in which the respective output voltages at the output terminals Q and QB are maintained. Therefore, compared to a general constant current comparator circuit which requires a constant current at all the time, the comparator circuit Cr1 of FIG. 5 has the advantage of largely reducing power consumption.

Figure 6:
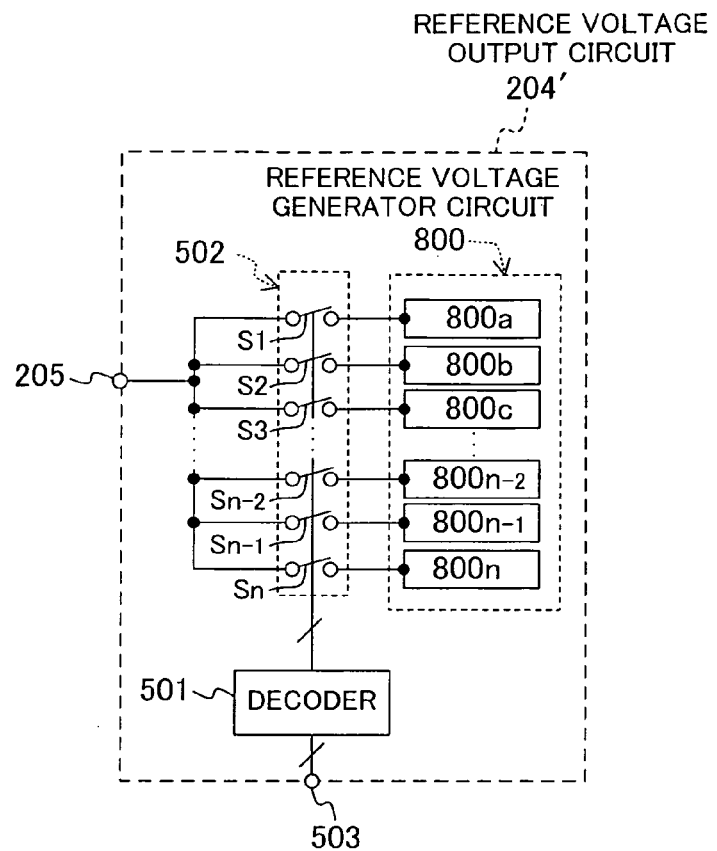
FIG. 6 is a diagram illustrating the internal configuration of a reference voltage output circuit provided in the regulator circuit of the A/D converter.

FIG. 6 is a diagram illustrating another example of the reference voltage output circuit 204 of FIG. 4. A reference voltage output circuit 204' of FIG. 6 is different from the reference voltage output circuit 204 in that a reference voltage generator circuit 800 for generating a plurality of reference voltages is formed. The reference voltage generator circuit 800 includes a plurality (n) of voltage producing circuits 800a through 800n. Each of the plurality of voltage producing circuits 800a through 800n generates a single reference voltage. The generated reference voltages are different to one another. The voltage producing circuit 800*a*, i.e., one of the voltage producing circuits 800*a* through 800*n* will be described as an example with reference to FIG. 7.

Figure 7:
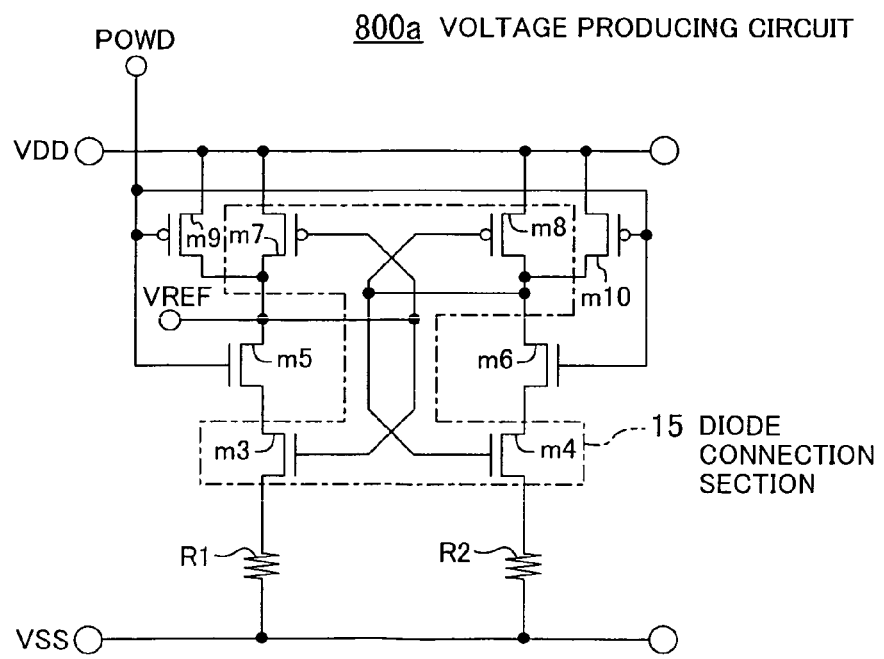
FIG. 7 is a diagram illustrating the internal configuration of a voltage generator circuit provided in the reference voltage output circuit.

The voltage producing circuit 800*a* of FIG. 7 has substantially the same configuration as that of the voltage comparator circuit Cr1 of FIG. 5. Different points between the voltage producing circuit 800*a* and the voltage comparator circuit Cr1 are: that the voltage comparator circuit Cr1 includes the positive feedback section 11 having the two NMOS transistors m3 and m4 and the two PMOS transistors m7 and m8 but the voltage producing circuit 800*a* of FIG. 7 includes, instead of the positive feedback section 11, a diode connection section 15 having the NMOS transistors m3 and m4 and the PMOS transistors m7 and m8; the voltage comparator circuit Cr1 of FIG. 5 includes the input transistor section 10 having the two NMOS transistors m1 and m2 but the voltage producing circuit 800*a* includes, instead of the input transistor section 10, two resistors R1 and R2; and to the respective gates of the NMOS switch transistors m5 and m6 and the PMOS switch transistors m9 and m10, not the clock terminal CLK but a voltage fixing terminal POWD to which a "High" level voltage is applied at all the time is connected. In the voltage producing circuit 800*a*, an output terminal VREF for outputting a reference voltage is connected to the gate of the PMOS transistor m7 of the diode connection section 15.

The configuration of the voltage producing circuit 800*a* of FIG. 7 is equivalent to the voltage comparator circuit Cr1 in the following state. In the voltage comparator circuit Cr1 of FIG. 5, when the clock signal is "High", i.e., when the two NMOS switch transistors m5 and m6 are ON and the two PMOS switch transistors m9 and m10 are OFF, the positive feedback 11 becomes operable. In this case, the two NMOS transistors m1 and m2 of the input transistor section 10 are operated in a linear region in which the drain currents are linearly changed by the gate voltages. In the NMOS transistor m1, the drain voltage VDS1 according to the input signal to the gate thereof is generated, and in the NMOS transistor m2, the drain voltage VDS2 according to the input signal to the gate thereof is generated. Then, a steady state right before a time when the positive feedback section 11 has become operable in this voltage generation state and starts an amplification operation is present. Thus, the voltage producing circuit 800*a* is equivalent to a circuit state of the voltage comparator circuit Cr1 in a steady state.

Accordingly, in this embodiment, using the respective configurations of the voltage producing circuit 800*a* of FIG. 7 and the voltage producing circuits 800*b* through 800*n*, i.e., a steady state of each of the voltage comparator circuit Cr1 of FIG. 5 and the voltage comparator circuits Cr2 through Crn+1, each of the voltage producing circuits 800*a* through 800*n* generates a single reference voltage. Thus, it is possible to regulate the non-inversion and inversion output voltages of the differential amplifier circuits A1 through An+1 to be accurately in the input dynamic range for the voltage comparator circuits Cr1 through Crn+1 while optimizing comparison sensitivity of each of the voltage comparator circuits Cr1 through Crn+1.

Moreover, in the voltage producing circuit 800*a* of FIG. 7, when a surrounding temperature is low, a threshold voltage of each of the PMOS transistors m7 and m8 and the NMOS transistors m3 through m6 is increased and an operation current flowing via the PMOS transistor m7, the NMOS transistors m5 and m3 and the resistor R1 or an operation current flowing via the PMOS transistor m8, the NMOS transistors m6 and m4 and the resistor R2 is reduced, compared to when a surrounding temperature is normal. In contrast, when the surrounding temperature is high, the operation currents are increased compared to when a surrounding temperature is normal. Therefore, the voltage producing circuit 800*a* has a relatively large temperature characteristic. In this case, assume that each of the resistors R1 and R2 is formed using a resistor element which has positive temperature dependency. At a low temperature, each of resistors R1 and R2 has a lower resistance value, thus thereby increasing the operation currents. At a high temperature, each of resistors R1 and R2 has a higher resistance value, thus thereby reducing the operation currents. Therefore, the temperature dependency of the voltage producing circuit 800*a* can be cancelled out.

Figure 8:
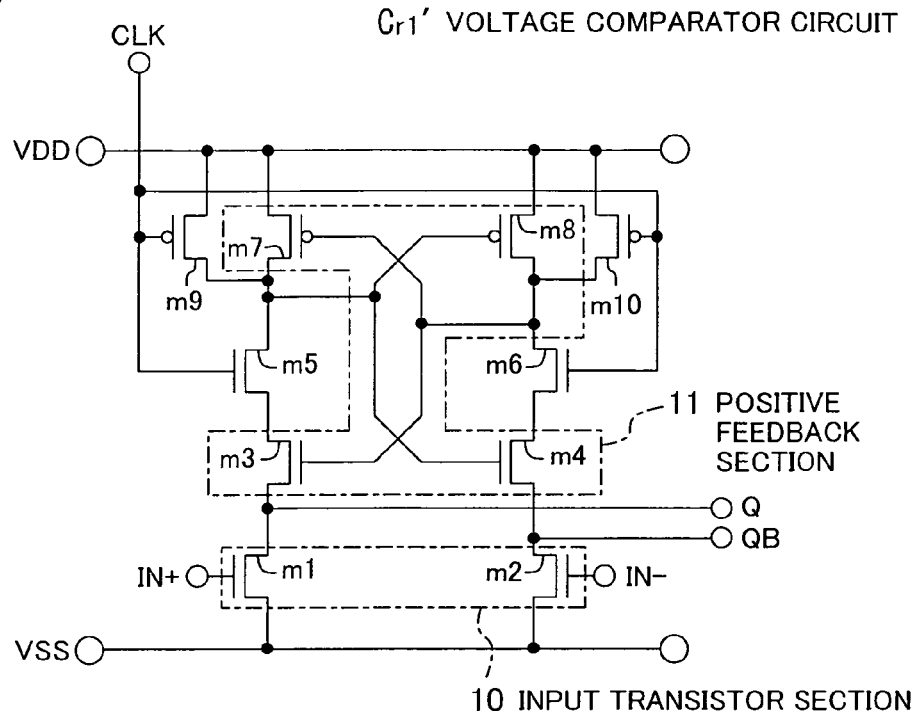
FIG. 8 is a diagram illustrating a modified example of the internal configuration of the voltage comparator circuit of FIG. 5.
Figure 9:
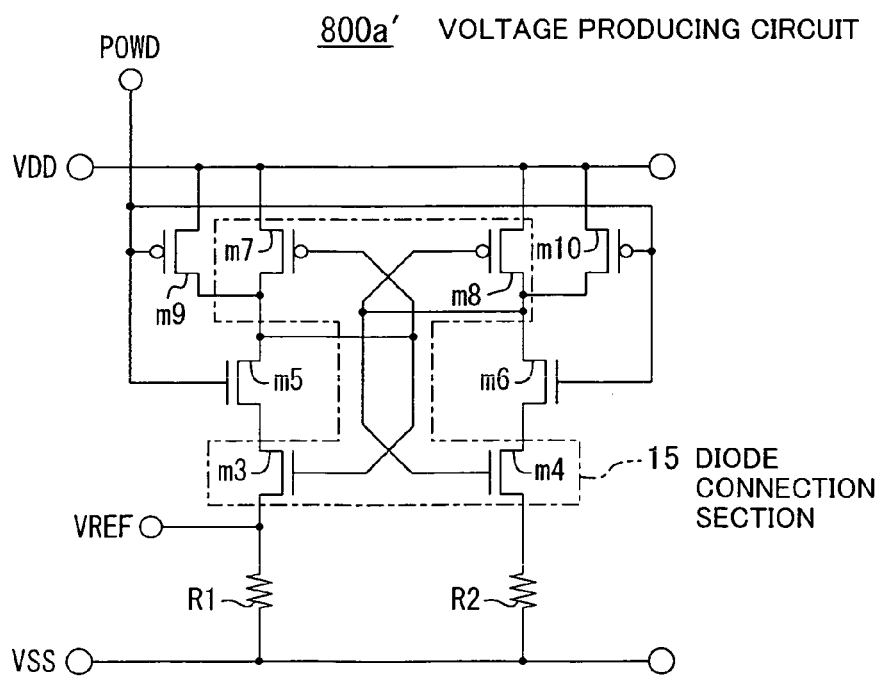
FIG. 9 is a diagram illustrating a modified example of the internal configuration of the voltage generator circuit of FIG. 7.

Note that in this embodiment, according to the configuration in which in the voltage comparator circuit Cr1 of FIG. 5, the complementary output terminal Q and inverse output terminal QB are connected to the gates of the PMOS transistors m8 and m7, respectively, in the voltage producing circuit 800*a* of FIG. 7, the reference voltage output terminal VREF is connected to the gate of the PMOS transistor m7 of the diode connection section 15. Needless to say, as another option, when the complementary output terminals Q and QB of the voltage comparator circuit CR1' are connected to the sources of the two NMOS transistors m3 and m4 of the positive feedback section 11, respectively, in this configuration, as shown in FIG. 8, the reference voltage output terminal VREF of the voltage producing circuit 800*a*' may be connected to the source of the NMOS transistor m3 of the diode connection section 15, as shown in FIG. 9.

Third Embodiment

Next, an A/D converting system according to a third embodiment of the present invention will be described.

Figure 10:
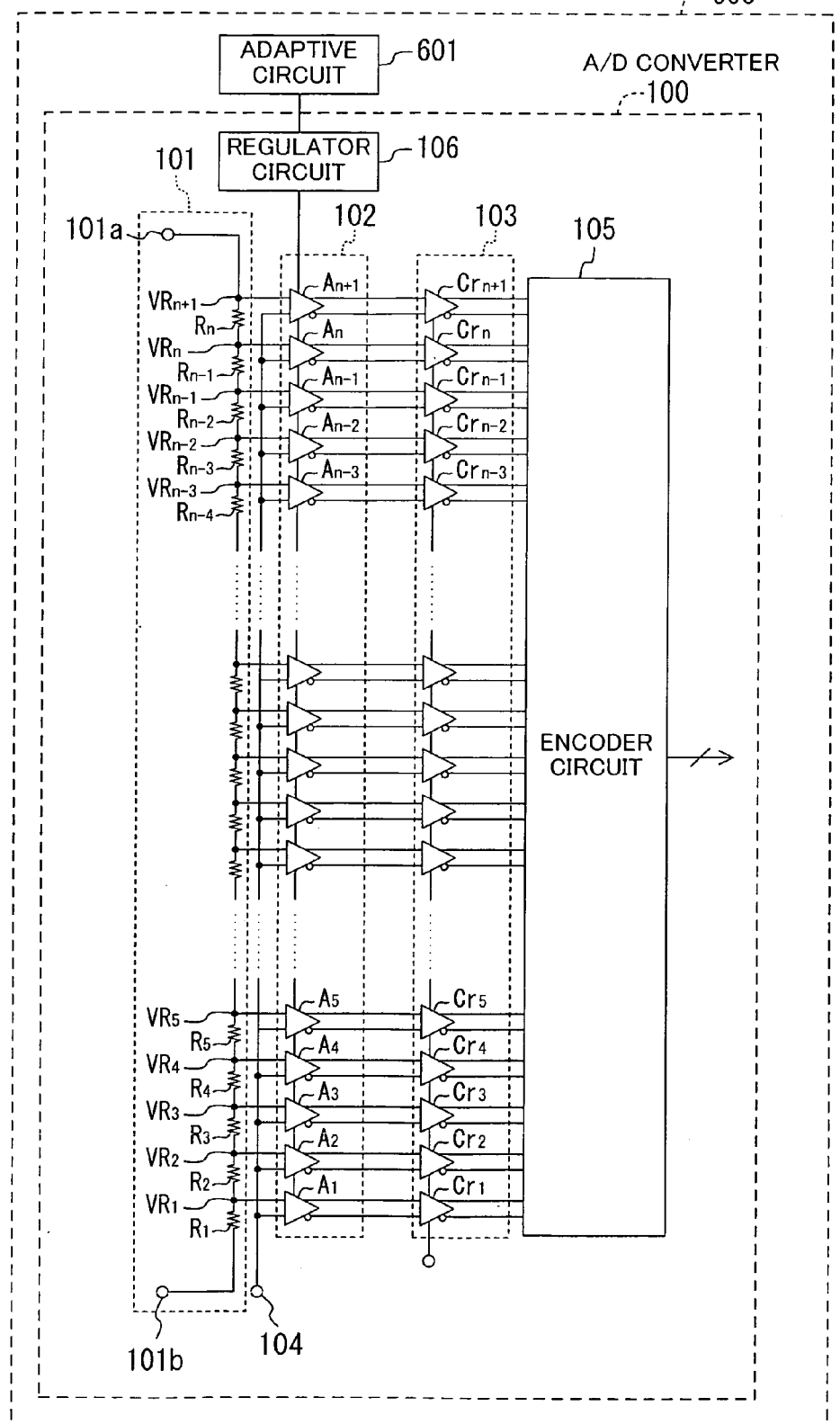
FIG. 10 is a block diagram illustrating the entire configuration of an A/D converting system according to a third embodiment of the present invention.

FIG. 10 is a diagram illustrating the entire configuration of an A/D converting system of this embodiment. An A/D converting system 600 of FIG. 10 includes an A/D converter 100 of FIG. 1 and an adaptive circuit 601 connected to the A/D converter 100.

The adoptive circuit 601 adaptively controls (leaning-controls) a predetermined reference voltage generated by the reference voltage output circuits 204 and 204' (of FIGS. 4 and 5) built in the regulator circuit 601 of the A/D converter 100 of FIG. 1. Hereinafter, the internal configuration of the adaptive circuit 601 will be described. Note that as the voltage comparator circuits Cr1 through Crn+1 of the A/D converter 100, the dynamic voltage comparator circuit of FIG. 5 or FIG. 8 may be used, and also, for the voltage producing circuits 800*a* through 800*n* of the reference voltage output circuit 204' of the regulator circuit 106, the configuration of FIG. 7 or FIG. 9 may be adopted.

Figure 11:
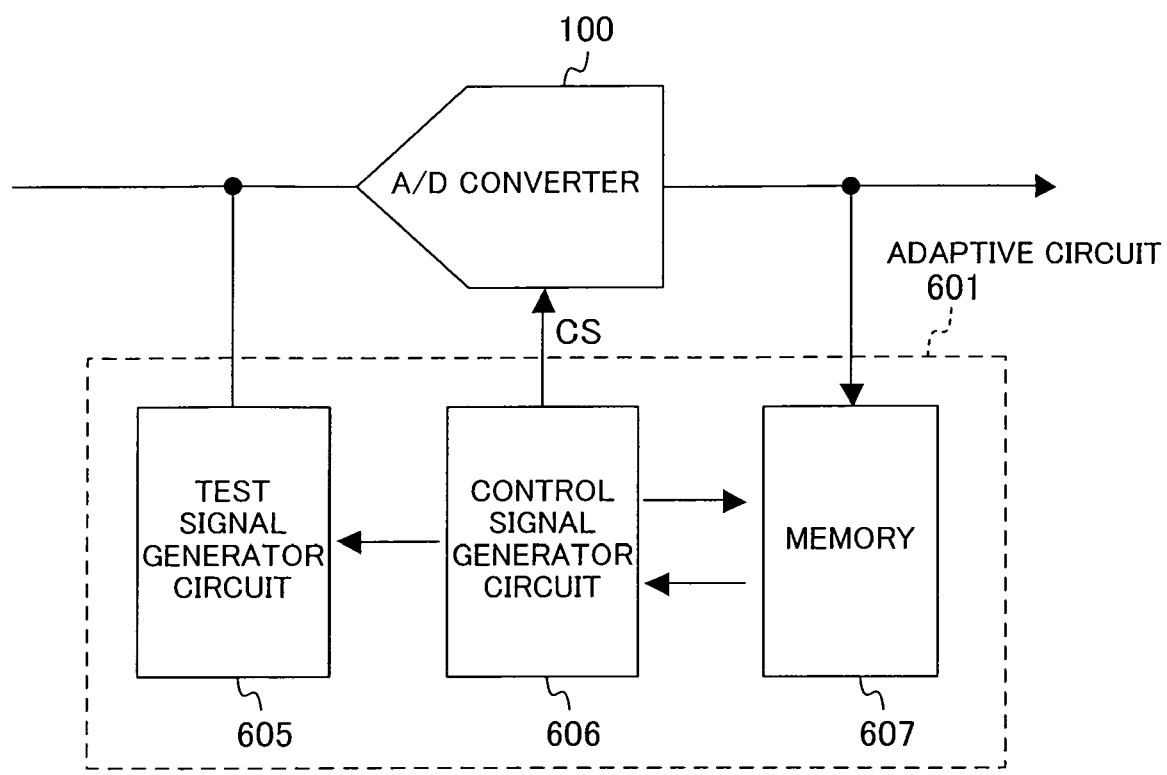
FIG. 11 is a block diagram illustrating the internal configuration of an adaptive circuit provided in the A/D converting system.
Figure 12:
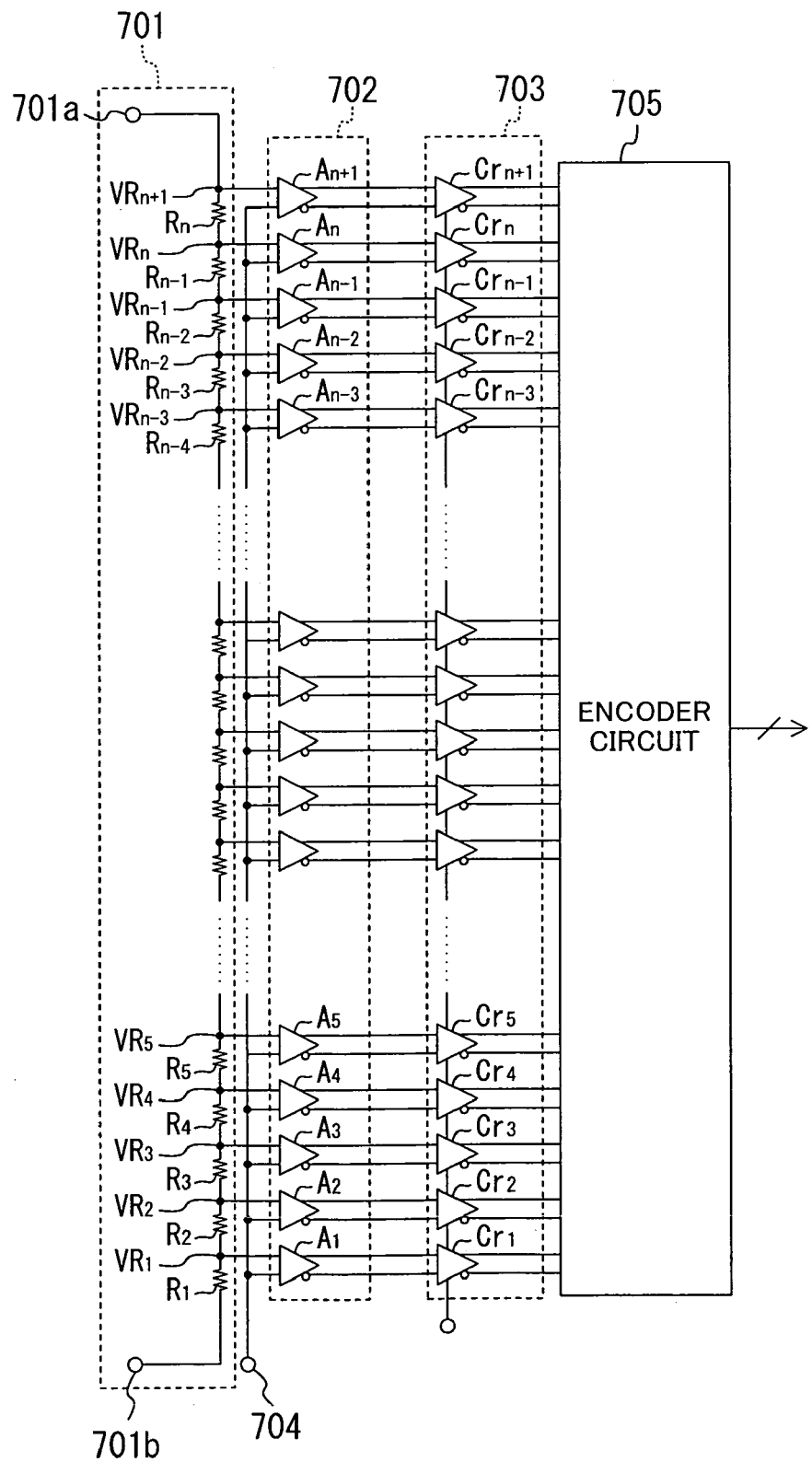
FIG. 12 is a diagram illustrating an example of the configuration of a known A/D converter.

FIG. 11 is a block diagram illustrating the internal configuration of the adaptive circuit 601. When the A/D converter 100 is powered ON or at regular intervals, the adaptive circuit 601 of FIG. 11 is operated prior to a normal operation of the A/D converter 100. The adaptive circuit 601 includes a test signal generator circuit 605 for generating an analog test signal for evaluation, a control signal generator circuit 606, and a memory 607.

At the power-up, the control signal generator circuit 606 makes the test signal generator circuit 605 to generate a test signal for evaluation and inputs the generated test signal to the A/D converter 100. Also, the control signal generator circuit 606 generates a control signal CS and inputs the control signal CS to the decoder 501 via the input terminals 503 of FIG. 4 or FIG. 6 to make the decoder 501 generate a selection signal of an initial value. As a result, in each of the reference voltage output circuits 204 and 204' of FIGS. 4 and 6, the reference voltage of an initial value is selected and, based on the reference voltage, the non-inversion and inversion output voltages from the differential amplifier circuits A1 through An+1 can be regulated.

In this manner, when with output voltages of the differential amplifier circuits A1 through An+1 regulated, the A/D converter 100 A/D-converts the test signal for evaluation from the test signal generator circuit 605, the memory 607 stores A/D conversion characteristic thereof and a value of the control signal CS.

The control signal generator circuit 606 generates again for the second time a test signal for evaluation from the test signal generator circuit 605 and also changes the value of the control signal CS so as to generate from the decoder 501 a selection signal for the next step. The memory 607 stores an A/D conversion characteristic of the A/D converter 100 at this state and the value of the control signal CS.

Thereafter, the control signal generator circuit 606 evaluates the two A/D conversion characteristics. If the A/D conversion characteristic obtained at the first time is favorable, the value of the control signal CS obtained at the first time is set to be an appropriate control signal. On the other hand, if the A/D conversion characteristic obtained at the second time is favorable, a test signal for evaluation is again generated from the test signal generator circuit 605, furthermore, and also the value of the control signal CS is changed so that a selection signal for the next step is generated from the decoder 501. In this state, an A/D conversion characteristic at the third time and a value of the control signal CS is stored in the memory 607 to evaluate the A/D conversion characteristics obtained at the second and third times. Thereafter, the above-described operation is repeated.

Therefore, in this embodiment, even when an appropriate reference voltage output from each of the reference voltage output circuits 204 and 204' of the regulator circuit 106 is changed due to changes in the power supply voltage and its degradation with time, the reference voltage can be adaptively controlled so as to be an appropriate voltage level. Thus, the non-inversion or inversion output voltages from the differential amplifier circuits A1 through An+1 preferably becomes in the input dynamic range for the voltage comparator circuits Cr through Crn+1, so that a stable A/D conversion characteristic can be obtained.

What is claimed is:

1. An A/D converter comprising:
   a reference voltage generator circuit for generating a plurality of reference voltages;
   a plurality of differential amplifier circuits, provided so as to correspond to the reference voltages generated by the reference voltage generator circuit, each for receiving an associated one of the reference voltages and a common input signal voltage, amplifying a voltage difference between the associated reference voltage and the input signal voltage and outputting complimentary non-inversion and inversion output voltages;
   a plurality of voltage comparator circuits, provided so as to correspond to the differential amplifier circuits, each for comparing the non-inversion and inversion output voltages from an associated one of the differential amplifier circuits and outputting a digital signal corresponding to a relationship between the non-inversion and inversion voltages in terms of voltage level;
   a coding circuit for coding a plurality of digital signals output from the plurality of voltage comparator circuits and outputting as a single digital data signal corresponding to the input signal voltage; and
   a regulator circuit for regulating the non-inversion and inversion output voltages of the plurality of differential amplifier circuits so that the non-inversion and inversion voltages are in an input range for the plurality of voltage comparator circuits,
   wherein the regulator circuit includes:
   a differential amplifier circuit replica, formed so as to have the same circuit configuration and shape as those of the differential amplifier circuits, for receiving an equal voltage to a voltage supplied to the differential amplifier circuits and outputting a common mode voltage, and
   an operational amplifier circuit for generating a feedback control voltage so that the common mode voltage output from the differential amplifier circuit replica matches a predetermined reference voltage and sending the feedback control voltage back to the differential amplifier circuit replica, and
   wherein the feedback control voltage from the operational amplifier is sent back to the plurality of differential amplifiers.

2. The A/D converter of claim 1, wherein the regulator circuit further includes a voltage comparator circuit replica, disposed between the differential amplifier circuit replica and the operational amplifier circuit and formed so as to have the same configuration and shape as those of the voltage comparator circuits, for receiving the common mode voltage from the differential amplifier circuit replica and outputting a common mode voltage corresponding to the received common mode voltage, and
   wherein the operational amplifier circuit generates a feedback control voltage so that the common mode voltage from the voltage comparator circuit replica matches a predetermined reference voltage.

3. The A/D converter of claim 2, wherein the regulator circuit further includes an average voltage generator circuit, disposed between the voltage comparator circuit replica and the operational amplifier circuit, for receiving two common mode voltages from the voltage comparator circuit replica and generating an average voltage of the common mode voltages, and
   wherein the operational amplifier circuit generates a feedback control voltage so that the average voltage of the common mode voltages from the average voltage generator circuit matches the predetermined reference voltage.

4. The A/D converter of claim 3, wherein the regulator circuit further includes a low-pass filter, disposed in an output side of the operational amplifier circuit, for removing a high-frequency component of the feedback control voltage from the operational amplifier circuit.

5. The A/D converter of any one of claims 1 through 4, wherein the regulator circuit further includes a reference voltage output circuit for generating the predetermined reference voltage and outputting the predetermined reference voltage, and
   wherein the reference voltage output circuit includes a reference voltage generator circuit for generating a plurality of reference voltages, and a selector circuit for receiving a selection signal, selecting any one of the plurality of reference voltages generated in the reference voltage generator circuit based on the selection signal, and outputting the selected voltage as the predetermined reference voltage.

6. The A/D converter of claim 5, wherein the reference voltage output circuit includes a decoder for receiving a control signal from the outside, generating the selection signal based on the control signal, and outputting the generated selection signal to the selector circuit.

7. The A/D converter of claim 5, wherein the reference voltage output circuit provided in the regulator circuit includes a resistor ladder, disposed between a power supply and a ground and formed of a plurality of resistors connected in series, for generating a different reference voltage between terminals of each of the plurality of resistors.

8. The A/D converter of claim 5, wherein each of the plurality of voltage comparator circuits includes an input transistor section having two NMOS transistors operating in a linear region for receiving non-inversion and inversion output voltages from an associated one of the differential amplifier circuits at gates, respectively, and a positive feedback section connected to respective drains of the two NMOS transistors and constituting a cross inverter latch.

9. The A/D converter of claim 8, wherein the reference voltage generator circuit of the reference voltage output circuit includes a plurality of voltage producing circuits,
wherein each of the plurality of voltage producing circuits produces a single reference voltage which is different from the other reference voltages, includes a diode connection section and two resistors connected to the diode connection section, and outputs as the single reference voltage a voltage at a predetermined node in the diode connection section or a voltage generated at either one of two connection points of the diode connection section and the two resistors.

10. The A/D converter of claim 9, wherein each of the two resistors is formed of a resistor with positive temperature dependency.

11. An A/D converting system comprising:
the A/D converter of claim 6; and
an adaptive circuit connected to the A/D converter,
wherein the adaptive circuit for adaptively controlling the predetermined reference voltage generated by the reference voltage output circuit provided in the A/D converter.

12. The A/D converter of claim 11, wherein the adaptive circuit includes
a test signal generator circuit for generating an analog test signal, outputting the test signal to the A/D converter, and making the A/D converter A/D-convert the test signal,
a memory for storing an A/D conversion characteristic when the A/D converter has A/D-converted the test signal, and
a control signal generator circuit for evaluating the A/D conversion characteristic stored in the memory, generating a control signal according to a result of the evaluation, and outputting the control signal to a decoder provided in the reference voltage output circuit of the A/D converter.

* * * * *